(12) United States Patent
Hokazono

(10) Patent No.: US 7,045,409 B2
(45) Date of Patent: May 16, 2006

(54) SEMICONDUCTOR DEVICE HAVING ACTIVE REGIONS CONNECTED TOGETHER BY INTERCONNECT LAYER AND METHOD OF MANUFACTURE THEREOF

(75) Inventor: Akira Hokazono, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/974,821

(22) Filed: Oct. 28, 2004

(65) Prior Publication Data

US 2005/0087806 A1    Apr. 28, 2005

Related U.S. Application Data

(62) Division of application No. 10/083,163, filed on Feb. 27, 2002, now Pat. No. 6,864,544.

(30) Foreign Application Priority Data

Dec. 25, 2001    (JP) .............................. 2001-392569

(51) Int. Cl.
*H01L 21/8238* (2006.01)

(52) U.S. Cl. ...................... 438/199; 438/213; 438/214; 438/222; 438/279

(58) Field of Classification Search ................ 438/199, 438/213, 214, 221, 222, 279, FOR. 212, 438/FOR. 223, FOR. 224
See application file for complete search history.

(56) References Cited

U.S. PATENT DOCUMENTS

| | | | |
|---|---|---|---|
| 5,573,969 A | | 11/1996 | Kim |
| 5,693,975 A | | 12/1997 | Lien |
| 5,818,069 A | | 10/1998 | Kadosh et al. |
| 6,521,508 B1 | * | 2/2003 | Cheong et al. ............. 438/416 |
| 6,559,043 B1 | | 5/2003 | Tseng et al. |
| 6,649,481 B1 | * | 11/2003 | Wu ............................ 438/301 |
| 2002/0079580 A1 | * | 6/2002 | Matsumura ................. 257/748 |

FOREIGN PATENT DOCUMENTS

JP    2000-114262    4/2000

* cited by examiner

*Primary Examiner*—Michelle Estrada
(74) *Attorney, Agent, or Firm*—Oblon, Spivak, McClelland, Maier & Neustadt, P.C.

(57) ABSTRACT

A semiconductor device having active regions connected by an interconnect line, which includes first and second transistors each having active regions and formed spaced apart from each other in a semiconductor substrate, an isolation region for isolating the first and second transistors from each other, a slit formed in the isolation region to allow those paired active regions of the first and second transistors which are opposed to each other with the isolation region interposed therebetween to communicate with each other through it, a conductive film formed on the inner walls of the slit, and an interconnect layer having first and second portions, each of which is electrically connected with a corresponding one of the paired active regions, and a third portion which is formed along the slit on the isolation region to connect the first and second portions with each other.

22 Claims, 10 Drawing Sheets

SEMICONDUCTOR DEVICE HAVING ACTIVE REGIONS CONNECTED TOGETHER BY INTERCONNECT LAYER AND METHOD OF MANUFACTURE THEREOF

CROSS-REFERENCE TO RELATED APPLICATIONS

This application is a divisional of U.S. application Ser. No. 10/083,163 filed on Feb. 27, 2002, now U.S. Pat. No. 6,864,544, and is based upon and claims the benefit of priority from the prior Japanese Application No. 2001-392569, filed Dec. 25, 2001, the entire contents of each of which are incorporated herein by reference.

BACKGROUND OF THE INVENTION

1. Field of the Invention

The present invention relates to a semiconductor device having N- and P-channel MOS transistors and a method of manufacture thereof. More specifically, the present invention relates to a semiconductor device in which MOS transistors have their active regions connected by an interconnect layer and a method of manufacture thereof.

2. Description of the Related Art

The demand has increased for enhancing the performance of LSI devices. In semiconductor process technology, on the other hand, advanced fine pattern techniques have been increasingly needed. Under these circumstances, it is essential to increase further the packing densities of LSI devices and, to this end, it is required to scale down the dimensions of devices as much as possible.

LSI devices contain many interconnect patterns for electrically connecting adjacent regions, for example, n- and p-type regions. In this case, the n- and p-type regions are isolated from each other by a shallow trench isolation region (hereinafter referred to as an STI) and electrically connected with each other by an overlying metal line.

SRAMs (Static Random Access Memories) contain interconnect patterns, called local interconnects, for interconnection of sources, gate electrodes and drains of MOS transistors. The method of forming the local interconnects involves forming a large opening in an interlayer dielectric film above the sources, gate electrodes and drains and filling the opening with a conductive material.

Figure 1:
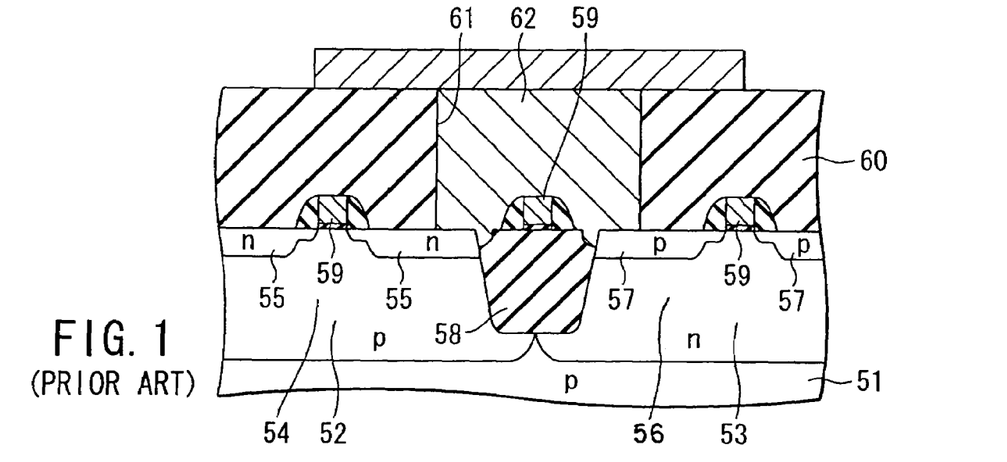
FIG. 1 is a sectional view of a conventional semiconductor device.

FIG. 1 is a sectional view of a conventional semiconductor device that has local interconnects. As shown in FIG. 1, the device has a p-type substrate 51. In the substrate 51 a p-type well region 52 and an n-type well region 53 are provided. In the p-type well region 52, n-type regions 55 are formed, which will be processed to provided the source and drain of an n-channel MOS transistor 54. In the n-type well region 53, p-type regions 57 are formed, which will be processed to provide the source and drain of a p-channel MOS transistor 56. An STI 58 is formed in the substrate 51 to isolate the MOS transistors 52 and 53 from each other. A gate electrode 59 is formed above a portion of the substrate between the paired n-type regions 55 of each of the MOS transistors 52 and a gate electrode 59 is formed above a portion of the substrate between the paired p-type regions 57 of the MOS transistor 53. A gate electrode 59 of another device is also formed above the STI 58. An interlayer dielectric film 60 is formed over the entire surface. An opening 61 is formed in the interlayer dielectric film 60 so that a portion of the n-type region 55 and the p-type region 57 on the STI side of each of the MOS transistors 54 and 56 and the gate electrode 59 above the STI 58 are exposed. A local interconnect is formed by filling the opening 61 with a conductive material 62.

To manufacture the semiconductor device of FIG. 1, the opening 61 is made by means of reactive ion etching (RIE). That part of STI 58 that contacts the diffusion region is inevitably etched away. A leakage current will flow between the local interconnect and the substrate.

A conventional semiconductor device having local interconnects is described in Japanese Unexamined Patent Publication No. 2000-114262. With this semiconductor device, paired active regions isolated by an STI are connected together by an interconnect line, which is formed through the use of selective growth and selective etching techniques for silicon.

Figure 2:
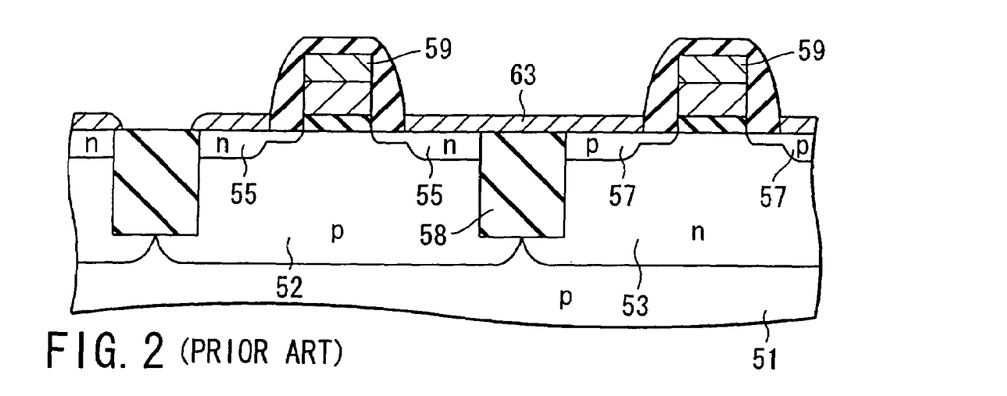
FIG. 2 is a sectional view of another conventional semiconductor device.

As FIG. 2 shows, the p-type well region 52 and the n-type well region 53 are provided in the surface of the p-type substrate 51. As described above, the n-type region 55 and the p-type region 57 are formed in the p-type well region 52 and the n-type well region 53, respectively. As specified above, too, the n-type region 55 will be processed to provided the source and drain of an n-channel MOS transistor 54, and the p-type region 57 will be processed to provide the source and drain of a p-channel MOS transistor 55. A film of amorphous silicon is deposited over the entire surface of the substrate and then subjected to a selective growth operation to form a film of monocrystalline silicon. After that, the amorphous silicon film in areas other than the interconnect-to-be-formed area is removed with the result that an interconnect 63 consisting of a silicide film is left in the interconnect-to-be-formed area. This interconnect 63 is formed across the STI 58.

With the semiconductor device shown in FIG. 2, there is no need of etching an interlayer dielectric film to form an opening, preventing leakage current occurring between the interconnect and the substrate as a result of the substrate being etched.

However, it is very difficult to leave the silicide film forming the interconnect 63 in a desired pattern.

The conventional semiconductor device is advantageous, however. A junction leakage current may flow when the diffusion regions isolated from one another by the isolation regions are connected by interconnect layers. Further, it is difficult to form the interconnect layers.

BRIEF SUMMARY OF THE INVENTION

According to an aspect of the present invention, there is provided a semiconductor device having active regions connected together by interconnect layers includes: first and second transistors formed spaced apart from each other in a semiconductor substrate, each of the first and second transistors having active regions; an isolation region formed between the first and second transistors in the semiconductor substrate for isolating the first and second transistors from each other; at least one slit formed in the surface of the isolation region to allow those paired active regions of the first and second transistors which are opposed to each other with the isolation region interposed therebetween to communicate with each other through it, the slit having inner walls and a predetermined width; a conductive layer formed on the inner walls of the slit; and an interconnect layer having first and second portions respectively formed on the paired active regions of the first and second transistors so that each of them is electrically connected with a corresponding one of the paired active regions, and a third portion formed along the slit on the isolation region, the first, second and third portions being made integral with one another.

According to another aspect of the present invention, there is provided a method of manufacturing a semiconductor device having active regions connected together by an interconnect layer includes, forming first and second device regions in a semiconductor substrate so that they are isolated from each other by an isolation region formed in the semiconductor substrate; forming at least one slit in the surface of the isolation region so that the first and second device regions communicate with each other through it, the slit having inner walls and a predetermined width; depositing a conductive layer, which includes of a material that can form a nucleus for epitaxial growth, over the entire surface of the semiconductor substrate and then selectively removing the conductive layer so that it is left on the surface of a portion of each of the first and second device regions and on the inner walls of the slit; and covering the periphery of the conductive film left on the portion of each of the first and second device regions with a material serving as a block for epitaxial growth and then epitaxially growing a conductive film so as to form an interconnect layer having first and second portions respectively located on the first and second device regions and a third portion located on the isolation region to run along the slit, the first, second and third portions being made integral with one another.

DETAILED DESCRIPTION OF THE INVENTION

Figure 3:
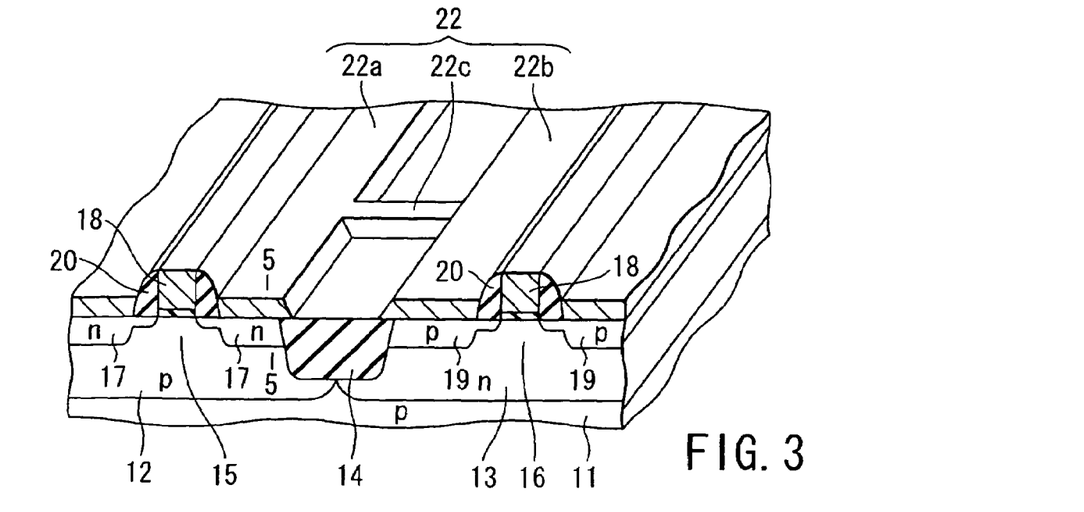
FIG. 3 is a perspective view of a portion of a semiconductor device according to a first embodiment of the present invention.

Referring now to FIG. 3, there is illustrated, in perspective view, a portion of a semiconductor device according to a first embodiment of the present invention.

The semiconductor device contains a p-type silicon substrate 11. In the surface of the substrate 11, a p-type well region 12 and an n-type well region 13 are provided. An STI 14 is provided in the surface of the substrate 11, isolating the p-type well region 12 and the n-type well region 13 from each other. In the p-type well region 12, an n-channel MOS transistor 15 is formed. In the n-type well region 13, a p-channel MOS transistor 16 is formed.

The n-channel MOS transistor 15 has two n-type diffusion regions 17 and a gate electrode 18. The diffusion regions 17 serve as the source and drain of the MOS transistor 15. The gate electrode 18 is made of, for example, polycrystalline silicon. The gate electrode 18 covers the channel region that lies between the source and drain of the MOS transistor 15. The n-type diffusion regions 17 comprise two diffusion regions each. The diffusion regions 17 define a deep junction and a shallow junction, respectively.

The p-channel MOS transistor 16 has two p-type diffusion regions 19 and a gate electrode 18. The diffusion regions 19 are provided in the n-type well region 13 and serve as the source and drain of the MOS transistor 16, respectively. The gate electrode 18 is made of, for example, polycrystalline silicon. The gate electrode 18 covers the channel region that lies between the source and drain of the MOS transistor 16. The p-type diffusion regions 19 comprise two diffusion regions each. The diffusion regions 19 define a deep junction and a shallow junction, respectively.

Gate sidewall spacer 20, such as a silicon oxide film or silicon nitride film, are formed on a sidewall of the gate electrodes 18 of the MOS transistors 15 and 16.

As will be described later, the STI 14 is formed with one slit that allows the n-type diffusion region 17 and the p-type diffusion region 19 located on opposite sides of the STI to communicate with the other. The slit has inner walls and a given width. The slit is formed on the inner walls with a conductive layer made of the same material as the gate electrode 18, namely, polysilicon. The slit is formed so that its bottom does not reach the bottom of the STI 14.

The n-type diffusion region 17 and the p-type diffusion region 19, which are opposed to each other with the STI 14 interposed therebetween, are respectively formed on top with a first portion 22a and a second portion 22b of an interconnect layer 22 made of a silicon-containing material and formed by means of epitaxial growth techniques. The first portion 22a of the interconnect layer 22 is electrically connected with the n-type diffusion regions 17, whereas the second portion 22b is electrically connected with the p-type diffusion region 19. A third portion 22c of the interconnect layer 22 is formed across the STI 14 to run along the slit in the STI. The third portion 22c is made integral with the first and second portions 22a and 22c.

The interconnect layer 22 is a stacked layer including, for example, a silicon layer and a metal silicide layer laid on the silicon layer. The layer 22 may include a silicon-germanium alloy layer and a metal silicide layer lying on the silicon-germanium alloy layer. The upper-surface region of the gate electrode 18 may be a silicide layer.

A method of manufacturing the semiconductor device constructed as shown in FIG. 3 will be described next in conjunction with FIGS. 4A through 4G and FIG. 5.

Figure 4A:
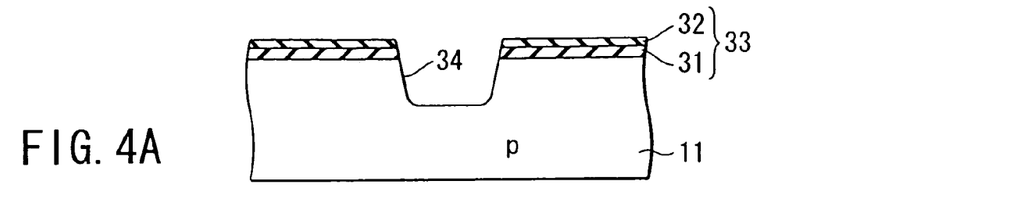
FIGS. 4A, 4B, 4C, 4D, 4E, 4F and 4G are sectional views, in the order of manufacturing step, of the semiconductor device shown in FIG. 3.

First, as shown in FIG. 4A, a film 31 of silicon nitride and a film 32 of silicon oxide are deposited in sequence on the surface of a silicon semiconductor substrate 11 of, say, p-type conductivity. Next, a PEP process is carried out to leave a composite film 33 of the silicon nitride film 31 and the silicon oxide film 32 in a desired pattern. Then, using the remaining composite film 33 as a mask, the substrate 11 is subjected to anisotropic etching—for example, reactive ion etching (RIE)—to form a device isolation trench 34 200 to 350 nm deep in it.

Figure 4B:
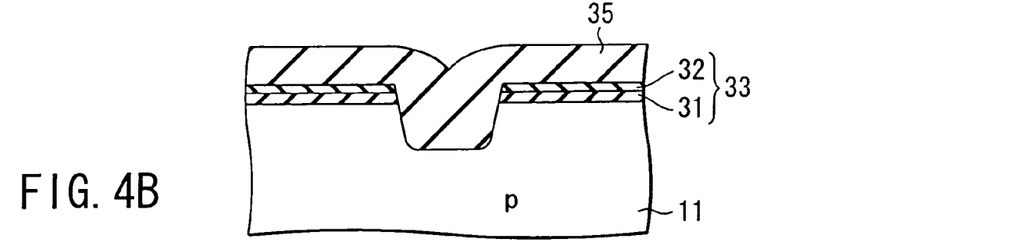

Next, as shown in FIG. 4B, a dielectric film 35, such as a silicon oxide film, is deposited over the entire surface of the substrate by means of, for example, CVD to fill the trench 34.

Figure 4C:
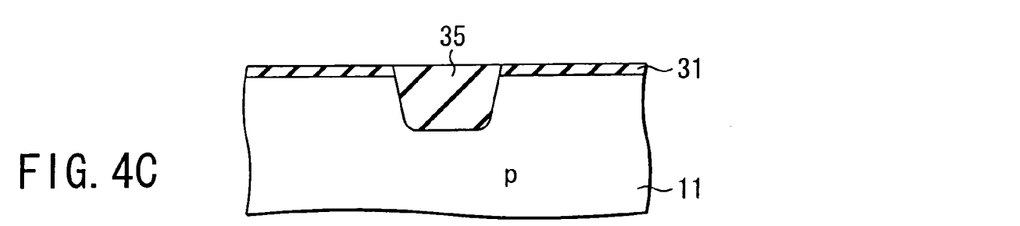

Subsequently, as shown in FIG. 4C, the surface of the substrate is smoothed by CMP (Chemical Mechanical Polishing).

Figure 4D:
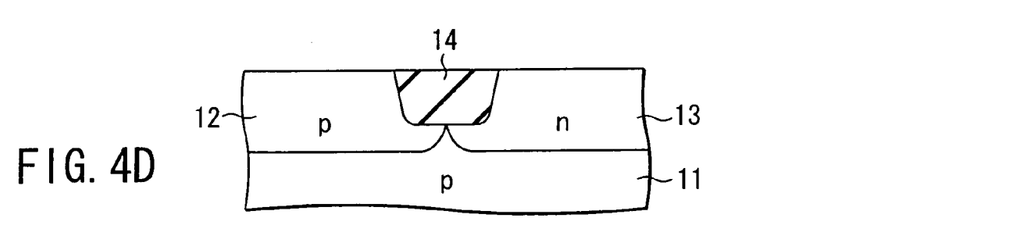

Next, as shown in FIG. 4D, the silicon nitride film 31 is removed by being processed with phosphoric acid heated to, say, 160° C. to thereby form an STI 14.

Next the p-type well region 12 and the n-type well region 13 are formed in the surface of the substrate 11.

Figure 4E:
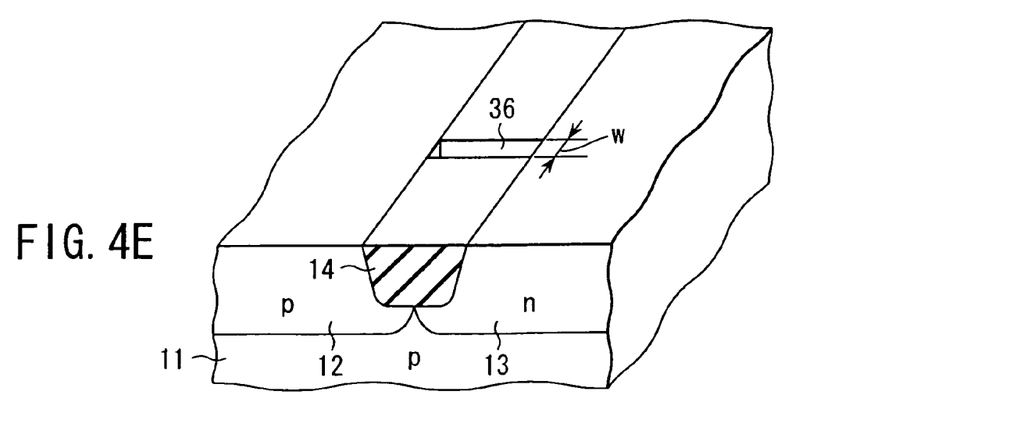

Subsequently, as shown in FIG. 4E, to form the aforementioned slit, the substrate is coated with a resist layer having such a pattern as to expose the area of the STI 14 where the slit is to be formed and then subjected to reactive ion etching using the resist layer as a mask to etch back the dielectric film 35 within the STI 14 to a depth of 30 to 100 nm, whereby a slit 36 is formed. The width W of the slit is set to, say, 0.03 to 0.1 μm. The minimum value, 0.03 μm, of the width of the slit corresponds to the minimum dimension determined by processing accuracy. The maximum value of 0.1 μm corresponds to the maximum width of the slit that can be filled up with the third portion 22c of the interconnect layer 22.

Figure 4F:
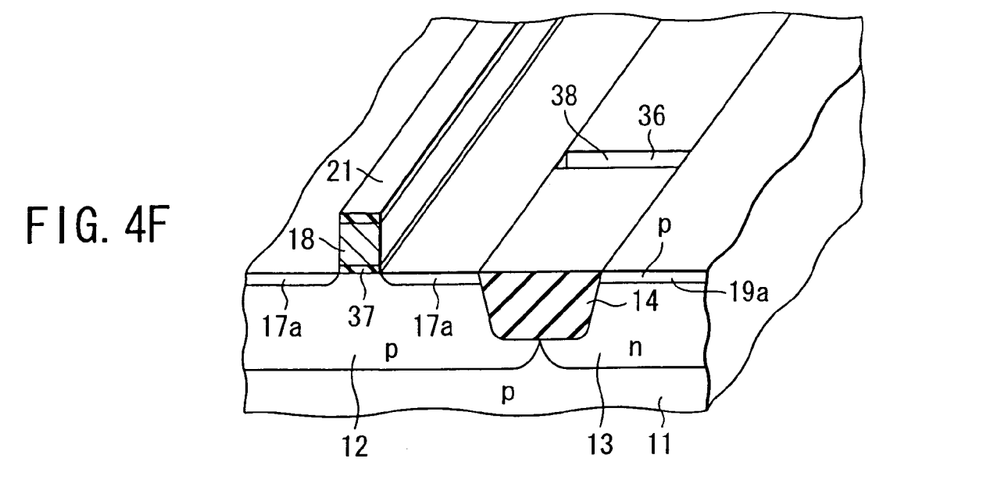

Next, impurity ions are implanted into those parts of the substrate that will be the channel regions of the n-channel, and p-channel MOS transistors. The threshold voltages of the MOS transistors are thereby adjusted to desired values. A gate insulating film 37 is then formed at a thickness of 0.5 to 3.0 nm over the entire surface by means of thermal oxidation or LP-CVD. A film 38 of polysilicon is then deposited over the entire surface at a thickness of 50 to 200 nm. An etching mask is then formed to pattern the polysilicon film 38 by means of photolithography, X-ray lithography, or e-beam lithography. The polysilicon film 38 is then etched by means of reactive ion etching (RIE) using that mask, whereby a gate electrode 18 is formed as shown in FIG. 4F. After the etching process, the polysilicon film 38 remains on the inner walls of the slit 36.

A silicon nitride film may be deposited after the gate insulating film 37 and the polysilicon film 38 have been deposited. In this case, the silicon nitride film may be etched and the polysilicon film 38 may be then etched, in the process of forming the gate electrode 18. Then, a capping layer 21, which is a silicon nitride film, remains on the gate electrode 18 as is illustrated in the perspective view of FIG. 4F. This capping layer 21 can be used as a block for the subsequent epitaxial growth.

Instead of forming the capping layer 21, a silicon-containing material may be formed on the gate electrode 18 by the subsequent epitaxial growth.

The step of forming the well region and the step of implanting impurity ions to adjust the threshold voltages of the MOS transistors may be carried out before the slit 36 is made.

As the gate insulating film 37, use may be made of not only silicon oxide but also any other dielectric, such as silicon oxynitride, silicon nitride, or tantalum oxide ($Ta_2O_5$).

With no epitaxial growth on the gate electrode 18, instead of the polysilicon film, a gate electrode may be formed with a metal gate structure in which TiN or WN is used as a barrier metal layer and W is further used. Alternatively, the gate electrode 18 may be formed from an alloy of silicon and germanium.

Thereafter, a post oxide film having a thickness of 0.5 to 6 nm is formed on the entire surface of the resultant structure. Then, n-type impurity ions are implanted into the p-type well region 12, forming a first n-type diffusion region 17a that has a shallow junction. P-type impurity ions are implanted into the n-type region 13, forming a first p-type diffusion region 19a that has a shallow junction.

Figure 4G:
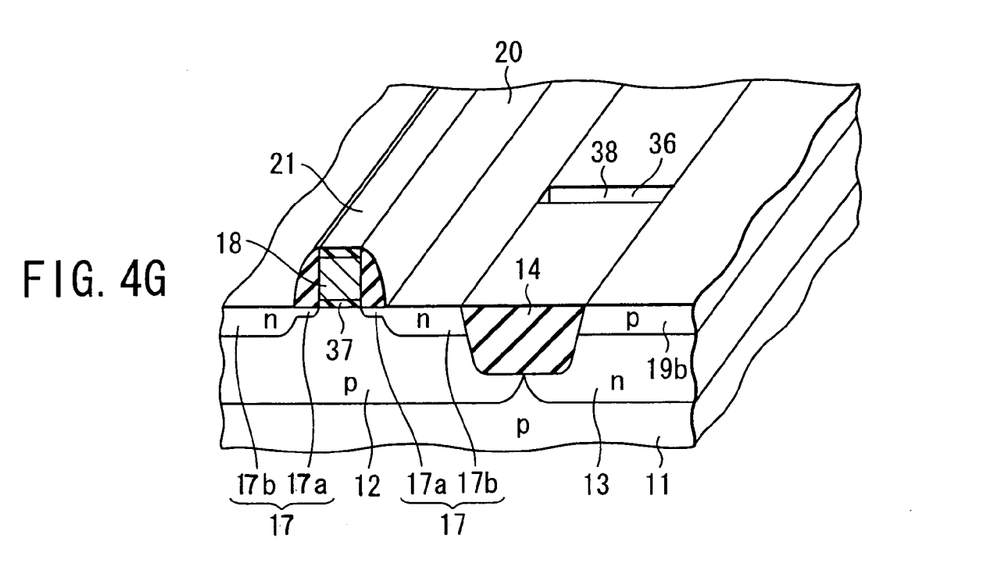

Next, as shown in FIG. 4G, a gate sidewall material is deposited over the entire surface by means of LP-CVD and then etched back through reactive ion etching (RIE) to thereby form the gate sidewall spacers 20. The gate sidewall spacers may be made of silicon nitride, silicon oxide, or a composite thereof.

Next, after natural oxide has been removed by high-temperature treatment in a hydrogen atmosphere, the selective growth of single-crystal silicon is carried out through epitaxial growth techniques. For example, by heating the entire structure to 650 to 800° C. in a hydrogen atmosphere in a reactor and introducing a reactant gas, such as $SiH_4$, $SiH_2Cl_2$, or $SiHCl_3$, together with hydrogen into the reactor, single-crystal silicon is grown on exposed areas of the Si substrate 11. It is also possible to grow an alloy of silicon and germanium rather than silicon.

By this epitaxial growth process, as shown in FIG. 3, an interconnect layer 22 of single-crystal silicon is formed on the n-type diffusion region 17 and the p-type diffusion region 19. In particular, first and second portions 22a and 22b of the interconnect layer 22 are respectively formed on the n-type diffusion regions 17 and the p-type diffusion region 19 on opposite sides of the STI 14.

During the epitaxial growth process, the epitaxial growth progresses with the polysilicon film 38 remaining on the inner walls of the slit 36 within the STI 14 as a nucleus. As a result, a film of silicon grows in the slit 36 so as to first fill it up and then protrude therefrom, whereby a third portion 22c of the interconnect layer 22 is formed to run along the slit 36. Finally, the third portion 22c is made integral with the first and second portions 22a and 22b.

If the capping layer 21 remains intact, diluted hydrofluoric acid is applied to the layer 21, removing the same. Then, n-type impurities are made to diffuse from the interconnect layer 22 into the p-type well region 12, and p-type impurities are made to diffuse from the interconnect layer 22 into the n-type well region 13. As a result, a second diffusion region 17b and a second diffusion region 19b are formed, both having a deep junction. At the same time, impurities are introduced into the gate electrode 18.

Figure 5:
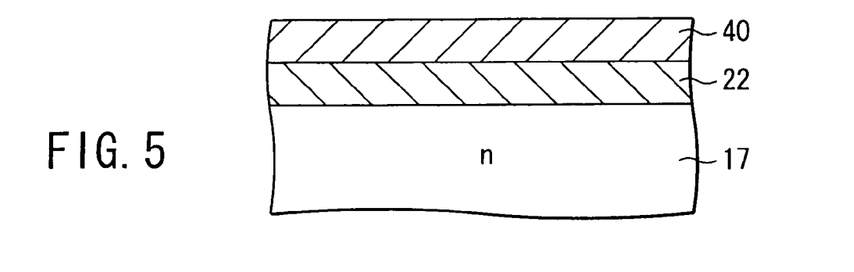
FIG. 5 is a sectional view taken along line 5—5 in FIG. 3.

FIG. 5 is a sectional view taken along line 5—5 in FIG. 3. A film of metal, such as Ti, Co, Ni, or Pd, is formed on the interconnect layer 22 and then subjected to heat treatment, whereby a layer 40 of metal silicide is formed on the interconnect layer 22. When an alloy of silicon and germanium is grown during the selective growth process to form the interconnect layer 22, the alloy layer is converted to the metal silicide layer 40.

The film of metal, such as Ti, Co, Ni, or Pd, is formed on the gate electrode 18, then the alloy layer is formed on the gate electrode 18.

According to the semiconductor device and the method of manufacture thereof of the first embodiment, the interconnect layer 22 to connect together the n-type diffusion region 17 of the n-channel MOS transistor 15 and the p-type diffusion region 19 of the p-channel MOS transistor 16, which are located on opposite sides of the STI 14, is formed continuously on those active regions and the STI. That is, there is no need of forming any contact in the edge portion of the STI, allowing the junction leakage problem to be resolved.

Furthermore, there is no need of securing space for the formation of contacts on active regions, allowing the circuit area to be reduced greatly. Depending on the occupied area of the third portion 22c of the interconnect layer 22 to connect together the diffusion regions 17 and 19 on opposite sides of the STI 14, SRAMs are allowed to have their circuit area reduced by 10 to 20 percent.

Figure 6:
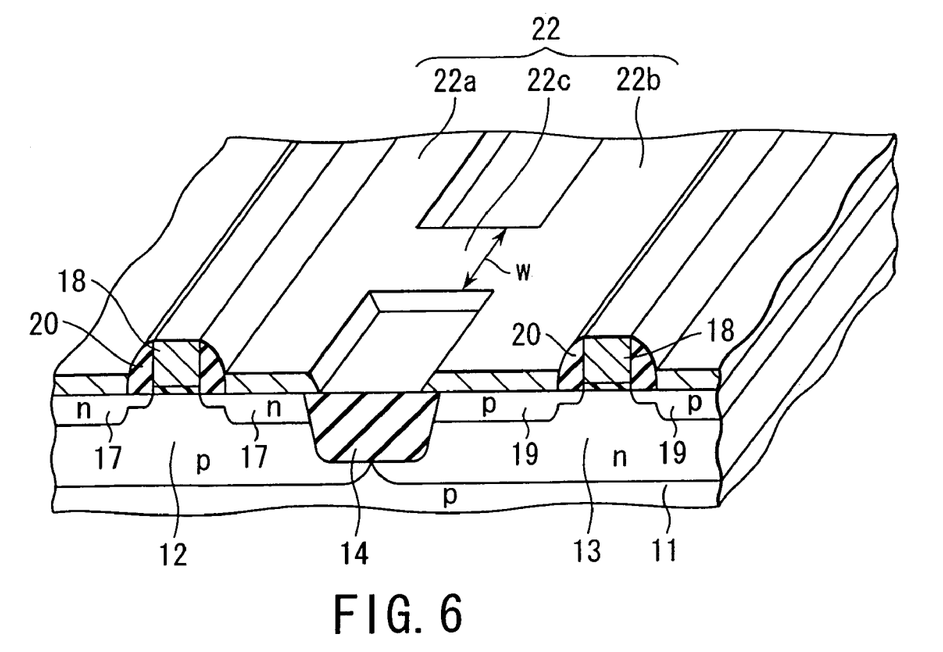
FIG. 6 is a perspective view of a portion of a semiconductor device according to a second embodiment of the present invention.

In FIG. 6, there is illustrated, in perspective view, part of a semiconductor device according to a second embodiment of the present invention. The second embodiment differs only in part from the first embodiment. In FIG. 6, therefore, parts corresponding to those in FIG. 3 are denoted by like reference numerals, and descriptions thereof are omitted. Only the differences from FIG. 3 will be described below.

The semiconductor device of FIG. 6 differs from that of FIG. 3 in that the width W of the third portion 22c of the interconnect layer 22, namely, the dimension of the third portion 22c in the direction perpendicular to the direction in which the first and second portions 22a and 22b are arranged, is made larger than in the semiconductor device of FIG. 3.

To make the width, W, of the third portion 22c of the interconnect layer 22 larger than that in FIG. 3, the semiconductor device of FIG. 6 has two or more slits 36 formed in the STI 14 so that they run between the n-type diffusion regions 17 and the p-type diffusion layer 19 located on opposite side of the STI. Each of the slits 36 has inner walls and a given width. A conductive layer of polysilicon is formed on the inner walls of the respective slits. The slits are formed so that their depth is less than that of the STI 14.

The method of manufacturing the semiconductor device thus constructed will be described next.

Up to the formation of the STI 14 in the substrate 11, the process steps remain unchanged from those described in conjunction with FIGS. 4A through 4D in the first embodiment and hence descriptions thereof are omitted.

Figure 7A:
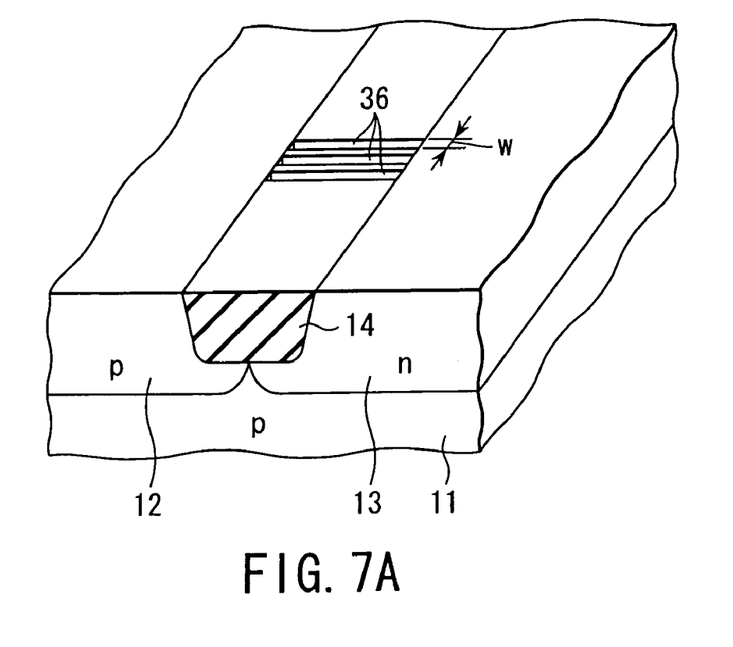
FIGS. 7A, 7B, and 7C are sectional views, in the order of manufacturing step, of the semiconductor device shown in FIG. 6.

In order to form the slits as shown in FIG. 7A after the formation of the STI 14 in the substrate 11, a layer of resist is coated onto the substrate and then patterned to define exposed areas of the STI which correspond to the slits. Subsequently, the trench-filling dielectric film 35 is etched back by 30 to 100 nm by means of reactive ion etching using the resist layer as a mask, whereby the parallel slits 36 are formed. In this example, three slits are formed. The width of these slits is set to, say, 0.03 to 0.1 μm as in the first embodiment.

Figure 7B:
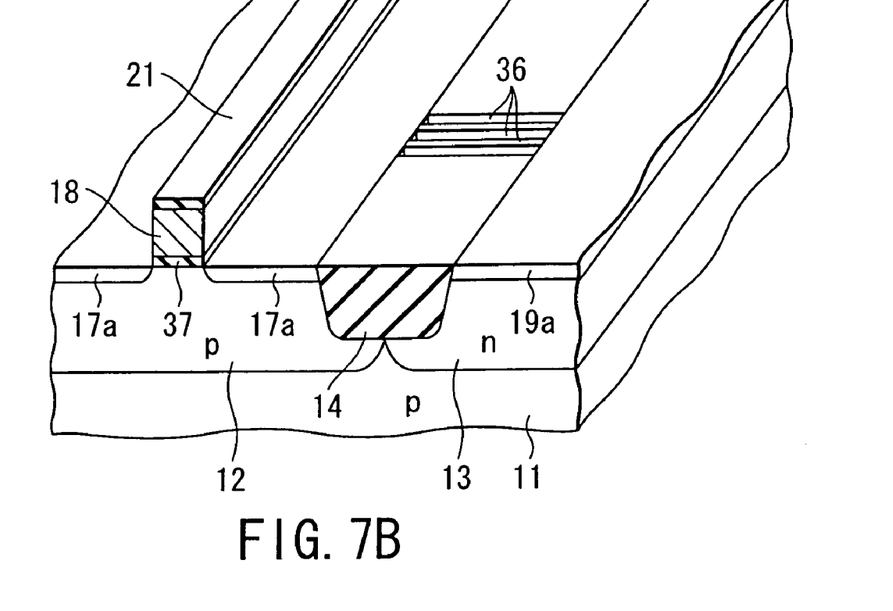

Next, as described previously in connection with FIG. 4F, impurity ions are implanted in portions of the substrate that form the channel regions of the p-channel and the n-channel MOS transistors for threshold adjustment, and a gate insulating film 37 is deposited over the entire surface at a thickness of 0.5 to 3.0 nm by means of thermal oxidation or LP-CVD. Subsequently, a film 38 of polysilicon is deposited over the entire surface at a thickness of 50 to 200 nm and then an etching mask for patterning the silicon film 38 is formed through photolithography, X-ray lithography, or e-beam lithography. Subsequently, the polysilicon film 38 is etched by means of reactive ion etching using the mask to define a gate electrode 18 as shown in FIG. 7B. At this point, the polysilicon film 38 is left on the inner walls of the respective slits 36.

Figure 7C:
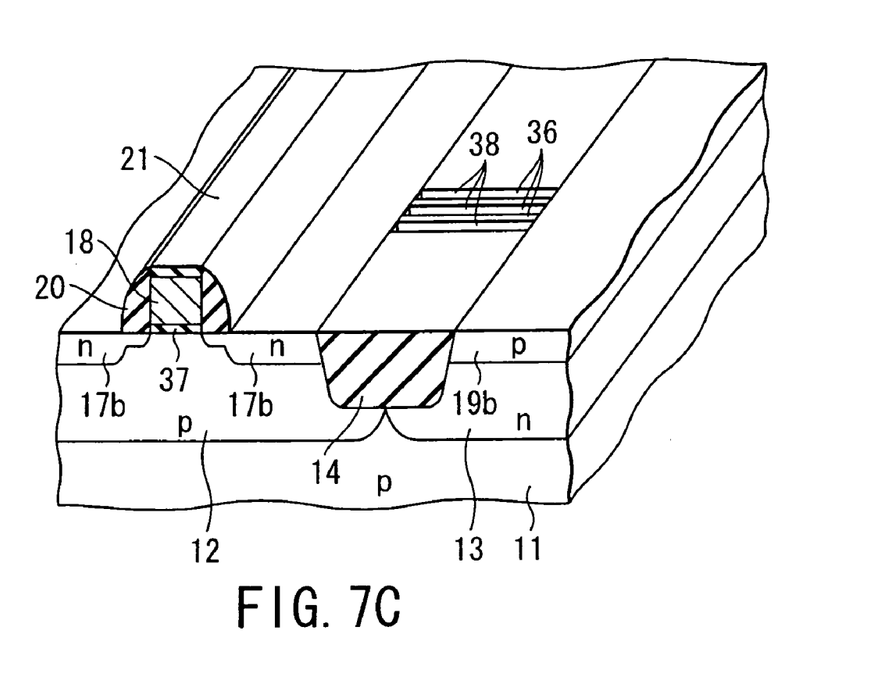

As shown in FIG. 7C and described previously in connection with FIG. 4F, a capping layer 21 of silicon nitride is allowed to remain on the gate electrode 18. This capping layer 21 can be used as a block for the subsequent epitaxial growth. Instead of forming the capping layer 21, a silicon-containing layer may be formed on the gate electrode 18 by the subsequent epitaxial growth.

As the gate insulating film 37, use may be made of not only silicon oxide but also any other dielectric, such as silicon oxynitride, silicon nitride, or tantalum oxide ($Ta_2O_5$).

With no epitaxial growth on the gate electrode 18, instead of the polysilicon film, a gate electrode may be formed with a metal gate structure in which TiN or WN is used as a barrier metal layer and W is further used. Alternatively, the gate electrode 18 may be formed from an alloy of silicon and germanium.

After that, a post oxide film of thickness 2 to 6 nm is formed over the entire surface through thermal oxidation and then n-type and p-type impurity ions are selectively implanted in the p-type well region 12 and the n-type well region 13, respectively, thereby forming the first diffusion regions 17a and 19b having shallow junctions.

Next, as shown in FIG. 7C, a gate sidewall material is deposited over the entire surface by means of LP-CVD and then etched back through reactive ion etching (RIE) to thereby form gate sidewall spacers 20. The gate sidewall spacers 20 may be made of silicon nitride, silicon oxide, or a composite thereof.

Next, the high-temperature treatment is carried out in a hydrogen atmosphere to remove natural oxide and then the selective growth of single-crystal silicon is carried out using epitaxial growth techniques. For example, by heating the entire structure to 650 to 800° C. in a hydrogen atmosphere in a reactor and introducing a reactant gas, such as $SiH_4$, $SiH_2Cl_2$, or $SiHCl_3$, together with hydrogen into the reactor, single-crystal silicon is grown on exposed areas of the Si substrate 11. It is also possible to grow an alloy of silicon and germanium rather than silicon.

By this epitaxial growth process, as shown in FIG. 6, an interconnect layer 22 of single-crystal silicon is formed on the n-type and p-type diffusion regions 17 and 19. In particular, first and second portions 22a and 22b of the interconnect layer 22 are formed on the n-type diffusion region 17 and the p-type diffusion region 19 on opposite sides of the STI 14, respectively.

During the epitaxial growth process, the epitaxial growth progresses with the polysilicon film 38 remaining on the inner walls of the slits 36 within the STI 14 as a nucleus. As a result, silicon grows in each of the slits 36 so as to first fill it up and then protrude therefrom. The growth of silicon further progresses, so that silicon films protruding from the slits 36 are made integral with one another, whereby a third portion 22c of the interconnect layer 22 is formed to run along the slits 36. Finally, the third portion 22c is made integral with the first and second portions 22a and 22b.

If the capping layer 21 remains intact, diluted hydrofluoric acid is applied to the layer 21, removing the same. Then, n-type impurities are made to diffuse from the interconnect layer 22 into the p-type well region 12, and p-type impurities are made to diffuse from the interconnect layer 22 into the n-type well region 13. As a result, a second diffusion region 17b and a second diffusion region 19b are formed, both having a deep junction. At the same time, impurities are introduced into the gate electrode 18.

After that, as described in connection with FIG. 5, a film of metal, such as Ti, Co, Ni, or Pd, is formed on the interconnect layer 22 and then subjected to heat treatment, whereby a layer 40 of metal silicide is formed on the interconnect layer 22. The film of metal, such as Ti, Co, Ni, or Pd, is formed on the gate electrode 18, then the alloy layer is formed on the gate electrode 18. When an alloy of silicon and germanium is grown during the selective growth process to form the interconnect layer 22, the alloy layer is also converted to the metal silicide layer 40.

The semiconductor device and the method of manufacture thereof according to the second embodiment provide the same advantages as the first embodiment. In addition, the width of the third portion 22c that connects the first and second portions 22a and 22b of the interconnect layer 22 is made larger than in the case of FIG. 3, allowing the resistance of the interconnect layer 22 connecting together the n-type and the p-type diffusion regions 17 and 19 to be rendered lower than in the case of FIG. 3.

Figure 8:
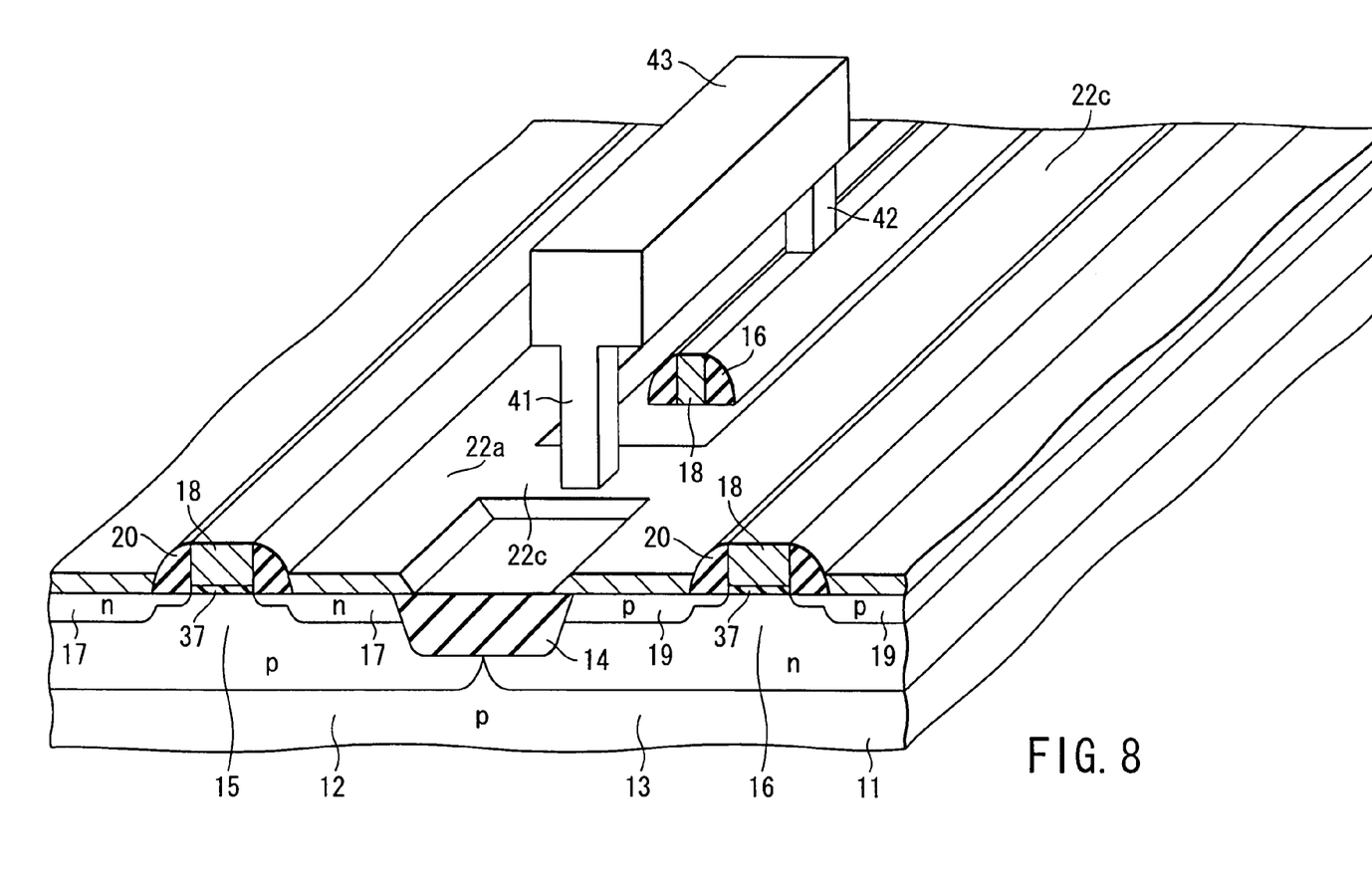
FIG. 8 is a perspective view of a portion of a semiconductor device according to a third embodiment of the present invention.

FIG. 8 illustrates, in perspective view, part of a semiconductor device according to a third embodiment of the present invention. The third embodiment differs only in part from the second embodiment shown in FIG. 6. In FIG. 8, therefore, parts corresponding to those in FIG. 6 are denoted by like reference numerals and descriptions thereof are omitted. Only the differences from FIG. 6 will be described below.

The semiconductor device of FIG. 8 differs from that of FIG. 6 in that a gate electrode 18 of another MOS transistor is formed above the STI 14, a contact plug 41 is formed on the third portion 22c of the interconnect layer 22, a contact plug 42 is formed on the gate electrode 18 of the other MOS transistor, and an upper interconnect layer 43 is formed to connect together the contact plugs 41 and 42, whereby the third portion 22c of the interconnect layer 22 and the gate electrode 18 of the other MOS transistor are connected together.

The method of manufacturing the semiconductor device thus constructed will be described next.

Up to the formation of the STI 14 in the substrate 11, the process steps remain unchanged from those shown in FIGS. 4A through 4D in the first embodiment and hence descriptions thereof are omitted.

Figure 9A:
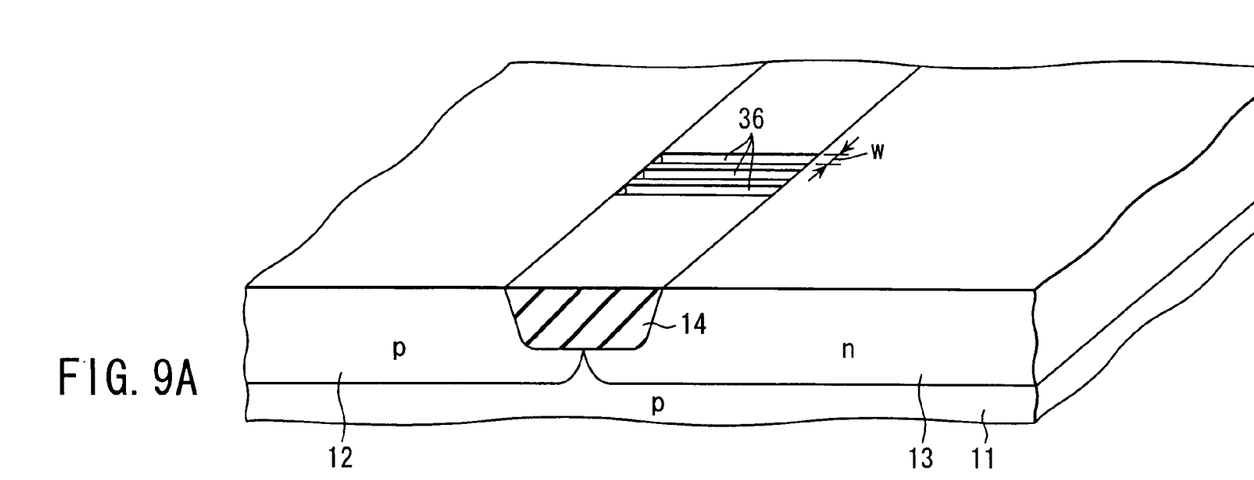
FIGS. 9A, 9B, 9C and 9D are sectional views, in the order of manufacturing step, of the semiconductor device shown in FIG. 8.

In order to form the slits as shown in FIG. 9A after the formation of the STI 14 in the substrate 11, a layer of resist is coated onto the substrate and then patterned to define exposed areas of the STI which correspond to the slits. Subsequently, the trench-filling dielectric film 35 is etched back by 30 to 100 nm by means of reactive ion etching using the resist layer as a mask, whereby the slits 36 are formed to run in parallel with one another. In this example, three slits are formed. The width W of these slits is set to, say, 0.03 to 0.1 µm as in the first embodiment.

Figure 9B:
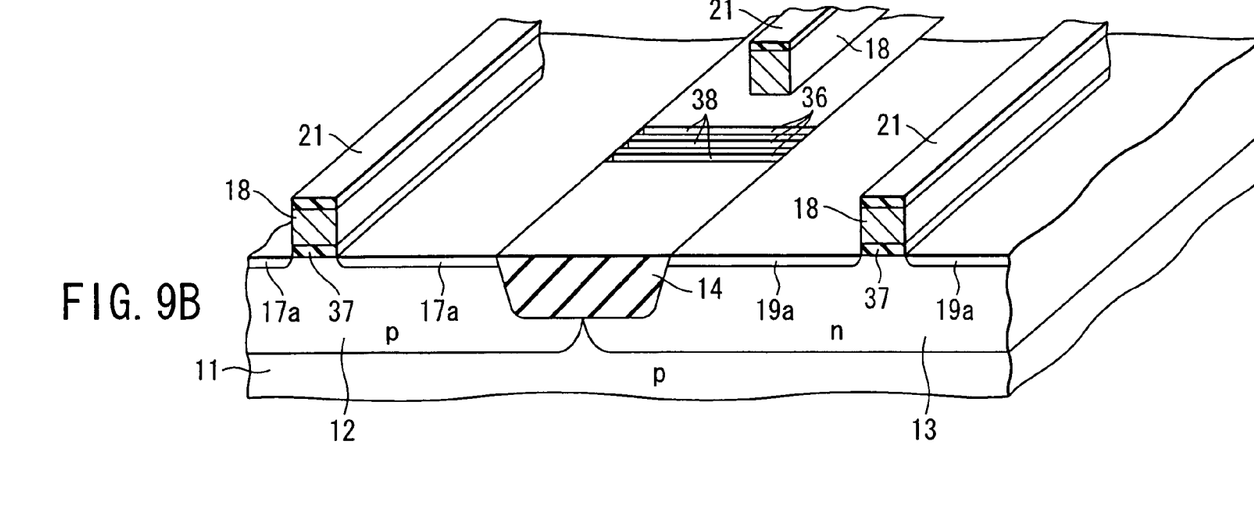

Next, impurity ions are implanted into those parts of the substrate that will be the channel regions of the n-channel, and p-channel MOS transistors. The threshold voltages of the MOS transistors are thereby adjusted to desired values and a gate insulating film 37 is deposited over the entire surface at a thickness of 0.5 to 3.0 nm by means of thermal oxidation or LP-CVD. Subsequently, a film 38 of polysilicon is deposited over the entire surface at a thickness of 50 to 200 nm and then an etching mask for patterning the silicon film 38 is formed through photolithography, X-ray lithography, or e-beam lithography. Subsequently, the polysilicon film 38 is etched by means of reactive ion etching using the mask to define a gate electrode 18 as shown in FIG. 9B. After this etching step, the gate electrode 18 is formed on the STI 14 as well. The polysilicon film 38 has been left on the inner walls of the respective slits 36. As shown in FIG. 9B and described in connection with FIG. 4F, a capping layer 21 of silicon nitride is allowed to remain on each of the gate electrodes 18. This capping layer 21 can be used as a block for the subsequent epitaxial growth. Instead of forming the capping layer 21, a silicon-containing material layer may be formed on the gate electrode 18 by the subsequent epitaxial growth.

As the gate insulating film 37, use may be made of not only silicon oxide but also any other dielectric, such as silicon oxynitride, silicon nitride, or tantalum oxide ($Ta_2O_5$).

With no epitaxial growth on the gate electrode 18, instead of the polysilicon film, a gate electrode may be formed with a metal gate structure in which TiN or WN is used as a barrier metal layer and W is further used. Alternatively, the gate electrode 18 may be formed from an alloy of silicon and germanium.

Thereafter, a post oxide film having a thickness of 0.5 to 6 nm is formed on the entire surface of the resultant structure. Then, n-type impurity ions are implanted into the p-type well region 12, forming a first n-type diffusion region 17a that has a shallow junction. P-type impurity ions are implanted into the n-type region 13, forming a first p-type diffusion region 19a that has a shallow junction.

Figure 9C:
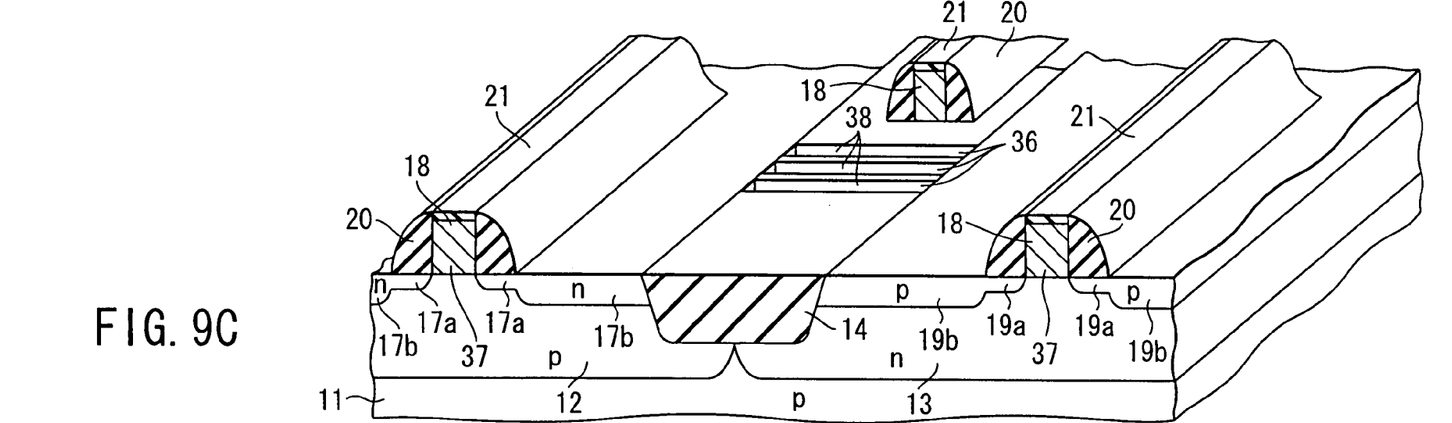

Next, as shown in FIG. 9C, a gate sidewall material is deposited over the entire surface by means of LP-CVD and then etched back through reactive ion etching (RIE) to thereby form gate sidewall spacers 20. The gate sidewall spacers 20 may be made of silicon nitride, silicon oxide, or a composite thereof.

Next, the high-temperature treatment is carried out in a hydrogen atmosphere to remove natural oxide and then selective growth of single-crystal silicon is carried out through epitaxial growth techniques. For example, by heating the entire structure to 650 to 800° C. in a hydrogen atmosphere in a reactor and introducing a reactant gas, such as $SiH_4$, $SiH_2Cl_2$, or $SiHCl_3$, together with hydrogen into the reactor, single-crystal silicon is grown on exposed areas of the Si substrate 11. It is also possible to grow an alloy of silicon and germanium rather than silicon.

Figure 9D:
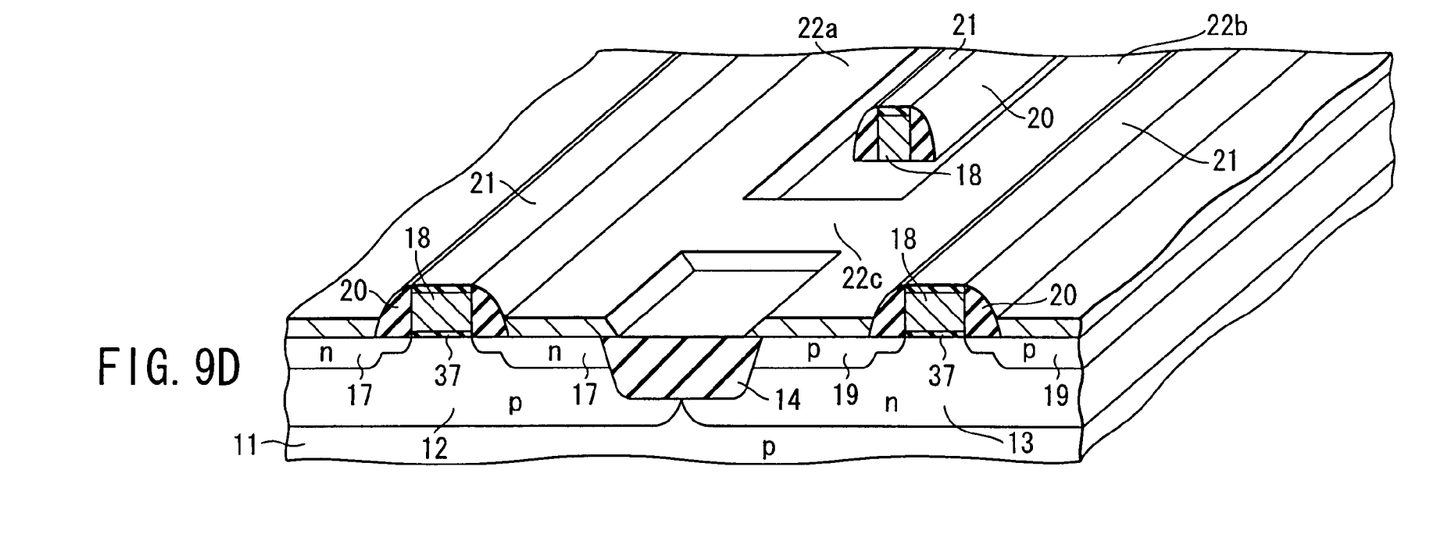

By this epitaxial growth process, as shown in FIG. 9D, an interconnect layer 22 of single-crystal silicon is formed on the n-type and p-type diffusion regions 17 and 19. In particular, first and second portions 22a and 22b of the interconnect layer 22 are formed on the n-type diffusion region 17 and the p-type diffusion region 19 on opposite sides of the STI 14, respectively.

During the epitaxial growth process, the epitaxial growth progresses with the polysilicon film 38 remaining on the inner walls of the slits 36 within the STI 14 as a nucleus. As a result, silicon grows in each of the slits 36 so as to first fill it up and then protrude therefrom. The growth of silicon further progresses, so that silicon films protruding from the slits 36 are made integral with one another, whereby a third portion 22c of the interconnect layer 22 is formed to run along the slit 36. Finally, the third portion 22c is made integral with the first and second portions 22a and 22b.

If the capping layer 21 remains intact, diluted hydrofluoric acid is applied to the layer 21, removing the same. Then, n-type impurities are made to diffuse from the interconnect layer 22 into the p-type well region 12, and p-type impurities are made to diffuse from the interconnect layer 22 into the n-type well region 13. As a result, a second diffusion region 17b and a second diffusion region 19b are formed, both having a deep junction. At the same time, impurities are introduced into the gate electrode 18.

After that, as described in connection with FIG. 5, a film of metal, such as Ti, Co, Ni, or Pd, is formed on the interconnect layer 22 and then subjected to heat treatment, whereby a layer 40 of metal silicide is formed on the interconnect layer 22. Subsequently, impurities are introduced into the interconnect layer 22 through the metal silicide layer 40. When an alloy of silicon and germanium is grown during the selective growth process to form the interconnect layer 22, the alloy layer is also converted to the metal silicide layer 40.

Subsequently, an interlayer insulating film is deposited over the entire surface and then openings are formed in the interlayer insulating film to expose portions of the third portion 22c of the interconnect layer 22 and the gate electrode 18 formed above the STI 14 where the contact plugs 41 and 42 are to be formed. Further, a metal for the upper interconnect layer is deposited over the entire surface and then patterned, thereby forming the contact plugs 41 and 42 and the upper interconnect layer 43 as shown in FIG. 8.

The semiconductor device and the method of manufacture thereof according to the third embodiment provide the same advantages as the first embodiment. In addition, the third portion 22c that connects the first and second portions 22a and 22b of the interconnect layer 22 is large in width, allowing the contact plug 41 to be formed readily on that portion.

Figure 10:
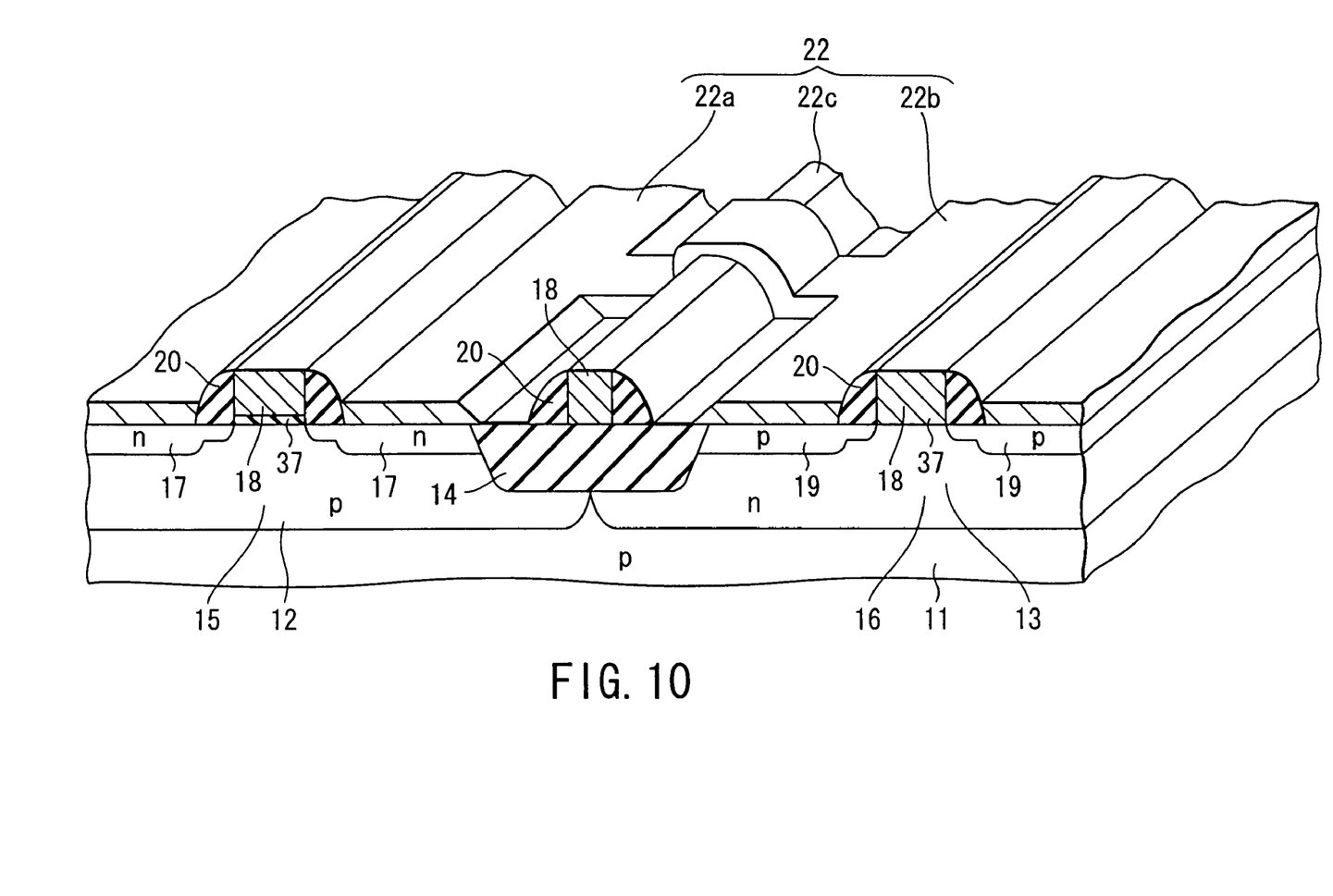
FIG. 10 is a perspective view of a portion of a semiconductor device according to a fourth embodiment of the present invention.

FIG. 10 illustrates, in perspective view, part of a semiconductor device according o a fourth embodiment of the present invention. The fourth embodiment differs only in part from the third embodiment shown in FIG. 8. In FIG. 10, therefore, parts corresponding to those in FIG. 8 are denoted by like reference numerals and descriptions thereof are omitted. Only the differences from FIG. 8 will be described below.

The semiconductor device of FIG. 10 differs from that of FIG. 8 in that the third portion 22c of the interconnect layer 22 is formed to ride on that gate electrode 18 of the other transistor which is located above the STI 14 while being electrically connected therewith. In this embodiment, as well as in the embodiments described so far, the third portion 22c is formed to run along the slits 36 in the STI 14 and is made integral with the first and second portions 22a and 22b of the interconnect layer 22.

The method of manufacturing the semiconductor device thus constructed will be described below.

Up to the formation of the STI 14 in the substrate 11, the process steps remain unchanged from those described in conjunction with FIGS. 4A through 4D in the first embodiment and hence descriptions thereof are omitted.

Further, up to the formation of the second diffusion regions 17b and 19b having deep junctions, the process steps remain basically unchanged from those described in connection with FIGS. 9A through 9C and hence descriptions thereof are omitted. As can be seen from FIGS. 9C and 11A, the fourth embodiment differs from the third embodiment only in that the gate electrode 18 of the other MOS transistor is formed with a length sufficient to cross the slits 36 in the direction in which the STI 14 extends. In this embodiment as well, when deposited to form the gate electrodes 18, the polysilicon film 38 is deposited onto the inner walls of the respective slits 36 as well.

Figure 11A:
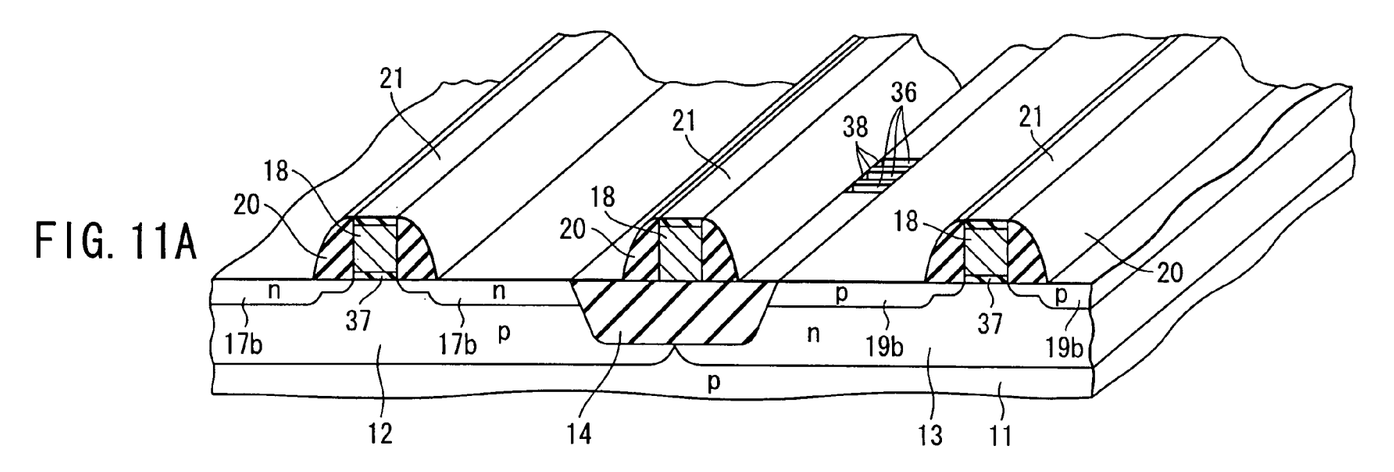
FIGS. 11A and 11B are sectional views, in the order of manufacturing step, of the semiconductor device shown in FIG. 10.
Figure 11B:
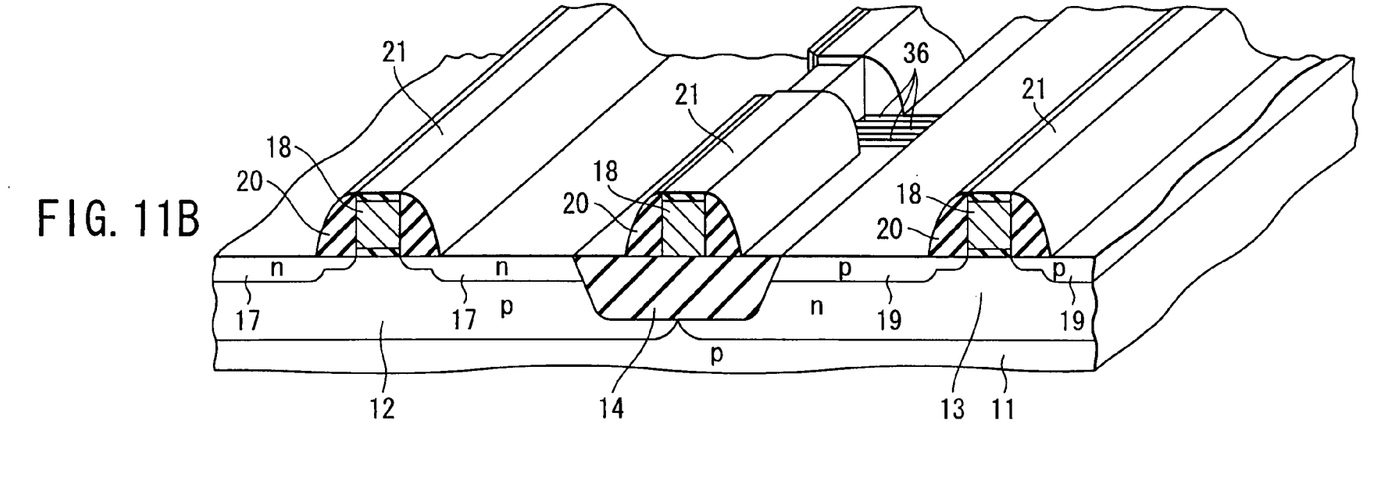

As shown in FIG. 11A, a gate sidewall material is deposited over the entire surface by means of LP-CVD and then etched back through reactive ion etching (RIE) to thereby form gate sidewall spacers 20. The gate sidewall spacers 20 may be made of silicon nitride, silicon oxide, or a composite thereof. Subsequently, n-type impurity ions are implanted into the p-type well region 12, forming a first n-type diffusion region 17a that has a shallow junction. P-type impurity ions are implanted into the n-type region 13, forming a first p-type diffusion region 19a that has a shallow junction, Next, as shown in FIG. 11B, the gate sidewall spacers 20 are selectively removed in the position on the STI 14 where that gate electrode and the slits 36 intersect.

After that, the interconnect layer 22 is epitaxially grown. If the capping layer 21 remains intact, diluted hydrofluoric acid is applied to the layer 21, removing the same. Then, n-type impurities are made to diffuse from the interconnect layer 22 into the p-type well region 12, and p-type impurities are made to diffuse from the interconnect layer 22 into the n-type well region 13. As a result, a second diffusion region 17b and a second diffusion region 19b are formed, both having a deep junction. At the same time, impurities are introduced into the gate electrode 18. Then, as described in connection with FIG. 5, a film of metal, such as Ti, Co, Ni, or Pd, is formed on the interconnect layer 22 and subjected to heat treatment, whereby a layer 40 of metal silicide is formed on the interconnect layer 22. The film of metal, such as Ti, Co, Ni, or Pd, is formed on the gate electrode 18, then the alloy layer is formed on the gate electrode 18. When an alloy of silicon and germanium is grown instead of silicon at the time of selective growth to form the interconnect layer 22, the alloy layer is also converted to the metal silicide layer 40.

The semiconductor device and the method of manufacture thereof according to the fourth embodiment provide the same advantages as the first embodiment. In addition, since the third portion 22c of the interconnect layer 22 can effect the same function as the contact plugs 41 and 42 and the upper interconnect layer 43 in the third embodiment shown in FIG. 8, the n-type diffusion region 17 and the p-type diffusion region 19 and the gate electrode 18 of the other MOS transistor can be connected together without using the contact plugs and the upper interconnect layer.

In the embodiments described above, although the embodiments have been described as the diffusion regions of MOS transistors which are connected by the interconnect layer 22 being of opposite conductivity type, this is not restrictive. The diffusion regions of MOS transistors of the same conductivity types may be connected together by the interconnect layer.

The interconnect layer 22 connects two diffusion regions that serve as the source and drains of each MOS transistor. The interconnect layer 22 may be used to connect two conductive layers that are diffusion regions formed in the substrate, isolated by an STI.

In the embodiment described above, the substrate is a p-type one. Nonetheless, an n-type substrate may be used in the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device having active regions connected together by an interconnect layer comprising:

forming first and second device regions in a semiconductor substrate so that they are isolated from each other by an isolation region formed in the semiconductor substrate;

forming at least one slit in the surface of the isolation region so that the first and second device regions communicate with each other through it, the slit having inner walls and a predetermined width;

depositing a conductive layer, which includes a material that can form a nucleus for epitaxial growth, over the entire surface of the semiconductor substrate and then selectively removing the conductive layer so that it is left on the surface of a portion of each of the first and second device regions and on the inner walls of the slit; and covering a periphery of the conductive film left on the portion of each of the first and second device regions with a material serving as a block for epitaxial growth and then epitaxially growing a conductive film so as to form an interconnect layer having first and second portions respectively located on the first and second device regions and a third portion located on the isolation region to run along the slit, the first, second and third portions being made integral with one another, wherein a plurality of slits is formed in the isolation region in parallel with one another.

2. The method according to claim 1, wherein the slits have a minimum value of their width set to the minimum dimension determined by processing accuracy and a maximum value set such that the slits can be substantially filled up with the third portion of the interconnect layer.

3. The method according to claim 2, wherein the minimum value of the slits width is 0.03 μm and the maximum value is 0.1 μm.

4. The method according to claim 1, wherein the slits are is formed so that their bottoms do not reach the bottom of the isolation region.

5. The method according to claim 1, wherein the conductive film includes a silicon-containing film.

6. The method according to claim 5, wherein the silicon-containing film is a polysilicon film.

7. The method according to claim 1, wherein the interconnect layer is formed to have a stacked structure including a lower layer of silicon and an upper layer of metal silicide.

8. The method according to claim 1, wherein the interconnect layer is formed to have a stacked structure including a lower layer of an alloy of silicon and germanium and an upper layer of silicon-germanium alloy silicide.

9. The method according to claim 1, further comprising forming a contact portion on the third portion of the interconnect layer.

10. A method of manufacturing a semiconductor device having active regions connected together by an interconnect layer comprising:

forming first and second device regions in the surface of a semiconductor substrate so that they are isolated from each other by an isolation region formed in the semiconductor substrate;

forming at least one slits in the surface of the isolation region so that the first and second device regions communicate with each other through it, the slits having inner walls and a predetermined width;

depositing a conductive film, which includes a material that can form a nucleus for epitaxial growth, over the entire surface of the semiconductor substrate and then selectively removing the conductive film so that it is left on the surface of a portion of each of the first and second device regions and the isolation region and the inner walls of the slit;

covering a periphery of the conductive film left on the portion of each of the first and second device regions and the isolation region with a material serving as a block for epitaxial growth;

selectively removing a portion of the blocking material located in the vicinity of the slit; and epitaxially growing a conductive film so as to form an interconnect layer having first and second portions respectively located on the first and second device regions and a third portion located on the isolation region to run along the slits and ride on the conductive film on the portion of the isolation region having the block forming material removed, the first, second and third portions being made integral with one another;

wherein a plurality of slits is formed in the isolation region in parallel with one another.

11. The method according to claim 10, wherein the slits have a minimum value of their widths set to the minimum dimension determined by processing accuracy and a maximum value set such that the slits can be substantially filled up with the third portion of the interconnect layer.

12. The method according to claim 11, wherein the minimum value of the slits is 0.03 μm and the maximum value is 0.1 μm.

13. The method according to claim 10, wherein the slits are formed so that their bottoms do not reach the bottom of the isolation region.

14. The method according to claim 10, wherein the conductive film is a silicon-containing film.

15. The method according to claim 14, wherein the silicon-containing film is a polysilicon film.

16. The method according to claim 10, wherein the interconnect layer is formed to have a stacked structure including a lower layer of silicon and an upper layer of metal silicide.

17. The method according to claim 10, wherein the interconnect layer is formed to have a stacked structure including a lower layer of an alloy of silicon and germanium and an upper layer of silicon-germanium alloy silicide.

18. The method according to claim 10, further comprising forming a contact portion on the third portion of the interconnect layer.

19. A method of manufacturing a semiconductor device having active regions connected together by an interconnect layer comprising:

forming first and second device regions in a semiconductor substrate so that they are isolated from each other by an isolation region formed in the semiconductor substrate;

forming at least one slit in the surface of the isolation region so that the first and second device regions communicate with each other through it, the slit having inner walls and a predetermined width;

depositing a conductive layer, which includes a material that can form a nucleus for epitaxial growth, over the entire surface of the semiconductor substrate and then selectively removing the conductive layer so that it is left on the surface of a portion of each of the first and second device regions and on the inner walls of the slit; and covering a periphery of the conductive film left on the portion of each of the first and second device regions with a material serving as a block for epitaxial growth and then epitaxially growing a conductive film so as to form an interconnect layer having first and second portions respectively located on the first and second device regions and a third portion located on the isolation region to run along the slit, the first, second and third portions being made integral with one another, wherein the interconnect layer is formed to have a stacked structure including a lower layer of an alloy of silicon and germanium and an upper layer of silicon-germanium alloy silicide.

20. The method according to claim 19, wherein one slit is formed in the isolation region.

21. A method of manufacturing a semiconductor device having active regions connected together by an interconnect layer comprising:

forming first and second device regions in the surface of a semiconductor substrate so that they are isolated from each other by an isolation region formed in the semiconductor substrate;

forming at least one slit in the surface of the isolation region so that the first and second device regions communicate with each other through it, the slit having inner walls and a predetermined width;

depositing a conductive film, which includes a material that can form a nucleus for epitaxial growth, over the entire surface of the semiconductor substrate and then selectively removing the conductive film so that it is left on the surface of a portion of each of the first and second device regions and the isolation region and the inner walls of the slit;

covering a periphery of the conductive film left on the portion of each of the first and second device regions and the isolation region with a material serving as a block for epitaxial growth;

selectively removing a portion of the blocking material located in the vicinity of the slit; and epitaxially growing a conductive film so as to form an interconnect layer having first and second portions respectively located on the first and second device regions and a third portion located on the isolation region to run along the slit and ride on the conductive film on the portion of the isolation region having the block forming material removed, the first, second and third portions being made integral with one another, wherein the interconnect layer is formed to have a stacked structure including a lower layer of an alloy of silicon and germanium and an upper layer of silicon-germanium alloy silicide.

22. The method according to claim 21, wherein one slits is formed in the isolation region.

* * * * *